(12) United States Patent
Kim et al.

(10) Patent No.: US 7,864,624 B2
(45) Date of Patent: Jan. 4, 2011

(54) SEMICONDUCTOR MEMORY DEVICE AND METHOD FOR OPERATING THE SAME

(75) Inventors: Kyung-Hoon Kim, Kyoungki-do (KR); Sang-Sic Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 98 days.

(21) Appl. No.: 12/154,936

(22) Filed: May 28, 2008

(65) Prior Publication Data

US 2009/0168546 A1 Jul. 2, 2009

(30) Foreign Application Priority Data

Dec. 26, 2007 (KR) .................. 10-2007-0138019

(51) Int. Cl.
*G11C 8/18* (2006.01)
(52) U.S. Cl. .................. 365/233.11; 365/233.12; 365/191; 365/189.05; 365/189.07
(58) Field of Classification Search ............ 365/189.05, 365/233.1, 233.11, 233.12, 189.07, 191
See application file for complete search history.

(56) References Cited

U.S. PATENT DOCUMENTS 6,407,608 B1 * 6/2002 Brown et al. ................. 327/291
7,209,397 B2 * 4/2007 Ware et al. ................... 365/194

FOREIGN PATENT DOCUMENTS

| KR | 2002-0031833 A | 5/2002 |
|---|---|---|
| KR | 2002-0043930 A | 6/2002 |

* cited by examiner

*Primary Examiner*—Hoai V Ho
*Assistant Examiner*—Kretelia Graham
(74) *Attorney, Agent, or Firm*—Blakely, Sokoloff, Taylor & Zafman

(57) ABSTRACT

A semiconductor memory device includes a first buffering unit configured to buffer a first clock for an address signal and a command to be input in synchronization with the first clock, a second buffering unit configured to buffer a second clock for a data signal to be in synchronization with the second clock to output a buffered second clock having the same frequency as the first clock, a data output circuit configured to output an internal data in response to the buffered second clock, a delay unit configured to delay the buffered second clock by a predetermined time, and a phase detector configured to detect a phase difference of an output clock of the delay unit and the output clock of the first buffering unit, and to output the detection result.

12 Claims, 4 Drawing Sheets

SEMICONDUCTOR MEMORY DEVICE AND METHOD FOR OPERATING THE SAME

CROSS-REFERENCE(S) TO RELATED APPLICATIONS

The present invention claims priority of Korean patent application number 10-2007-0138019, filed on Dec. 26, 2007, which is incorporated by reference in its entirety.

BACKGROUND OF THE INVENTION

The present invention relates to a semiconductor device, and more particularly to a semiconductor memory device capable of performing a clock alignment training especially to output internal data at a predetermined timing regardless of variations of process, voltage, and temperature (PVT), and a method for operating the semiconductor memory device.

In a system with a variety of semiconductor devices, a semiconductor memory device serves as a data storage. The semiconductor memory device outputs data corresponding to addresses received from a data processor, e.g., a memory control unit (MCU), or stores data received from the data processor into memory cells selected by the addresses.

As the operating speed of the system is increasing and semiconductor integrated circuit technologies are advanced, semiconductor memory devices are required to input and output data at higher speed.

To meet this requirement, a synchronous semiconductor memory device was developed. The synchronous memory device is designed to input and output data in synchronization with a system clock. While the synchronous memory device inputs or outputs at one edge of the system clock, e.g., a rising edge, a double data rate (DDR) synchronous semiconductor memory device, which can input or output at falling edges and rising edges of the system clock, was developed, in order to increase a data input/output speed.

The DDR synchronous semiconductor memory device must be able to process two data during one cycle of the system clock so as to input or output data at a falling edge and a rising edge of the system clock. Specifically, the DDR synchronous semiconductor memory device should receive or output data exactly in synchronization with the rising edge and the falling edge of the system clock in order to perform data input/output operations without error.

To this end, a data output circuit is provided in the DDR synchronous semiconductor memory to control a timing of transferring and outputting internal data such that data is output in synchronization with rising and falling edges of the system clock.

However, even the DDR synchronous semiconductor memory device cannot meet the requirement of recent systems for inputting/outputting mass amounts of data at high speed. Therefore, recently, methods for increasing the speed of inputting/outputting addresses and thus increasing the speed of inputting/outputting data are being developed widely.

For example, in a typical DDR synchronous semiconductor memory device, the addresses are, together with an operation command, input in synchronization with a rising edge of a system clock. However, in a recently developed high-speed semiconductor memory device, the addresses are input in synchronization with a rising edge and a falling edge of the system clock, respectively.

In other words, the typical DDR synchronous semiconductor memory device receives one address and one operation command—i.e., corresponding to a rising edge of a system clock—from the outside in each cycle of the system clock to perform an internal operation. However, the recently developed high-speed semiconductor memory device receives two addresses—i.e., corresponding to the rising edge and the falling edge, respectively—and one operation command from the outside in each cycle of the system clock to perform an internal operation.

Therefore, the high-speed semiconductor memory device is being designed to receive addresses in synchronization with a falling edge as well as a rising edge of a system clock inputted from the outside. Consequently, the high-speed semiconductor memory device may have the following characteristics.

First, because the high-speed semiconductor memory device can receive two addresses in one cycle of the system clock, it is possible to reduce the number of pins for receiving addresses by half in comparison to the typical DDR synchronous semiconductor memory device.

Second, the extra pins which can be reduced as described above can be used for receiving a power supply voltage VDD or a ground voltage VSS. Accordingly, it is possible to stably supply the power supply voltage VDD and the ground voltage VSS, and thus increase the operation speed.

Third, the high-speed semiconductor memory device can receive two times more addresses than the typical DDR synchronous semiconductor memory device and the same number of operation commands as the typical DDR synchronous semiconductor memory device in each cycle of the system clock. Accordingly, the high-speed semiconductor memory device can control two times more memory capacity than the typical DDR synchronous semiconductor memory device with the same number of operation commands.

Further, the recently developed high-speed semiconductor memory device may have higher speed of inputting/outputting data than the typical DDR synchronous semiconductor memory device.

That is, whereas the typical DDR synchronous semiconductor memory device inputs/outputs data twice—i.e., corresponding to a rising edge and a falling edge of the system clock, respectively—in one cycle of the system clock, the high-speed semiconductor memory device can input/output data four times—twice corresponding to the rising edge, and twice corresponding to the falling edge—in one cycle of the system clock.

In summary, the high-speed semiconductor memory device is designed to input/output two data between a rising edge and a falling edge of the system clock, and input/output two data between the falling edge and the next rising edge. That is, four data are input/output in one cycle of the system clock.

However, since the system clock has only two logic states, a logic high state and a logic low state, in order to input/output four data in one cycle, a data clock having a frequency two times higher than the system clock is required. That is, a special clock for inputting/outputting data is additionally required.

Therefore, the high-speed semiconductor memory device inputs/outputs an address and a command based on the system clock while inputting/outputting data based on the data clock. Here, the data clock has two times higher frequency than the system clock.

In other words, two cycles of data clock run in one cycle of system clock, and the data is input/output at a rising edge and a falling edge of the data clock, respectively. Consequently, four data can be input/output in one cycle of the system clock.

As described above, contrary to the typical DDR synchronous semiconductor memory device performing a read or a write operation based on a single clock (a system clock), the high-speed semiconductor memory device performs a read or a write operation based on two clocks of different frequencies.

However, if the phases of the system clock and the data clock are not aligned, then the basis for transferring an operation command and an address and the basis for transferring data cannot be aligned either. This also means that the high-speed semiconductor memory device cannot operate normally.

Therefore, in order that the high-speed semiconductor memory device can operate normally, an interface training should be performed between a semiconductor memory device and a data processor in an early stage of the operation.

The interface training is a process for training the semiconductor memory device and the data processor so that they operate at a timing when an interface for transferring commands, addresses, and data is optimized, before the normal operation of the semiconductor memory device and the data processor.

Such an interface training includes an address training, a clock alignment training (WCK2CK training), a read training, a write training, and the like. The clock alignment training performs an operation for aligning a data clock and a system clock.

SUMMARY OF THE INVENTION

Embodiments of the present invention are directed to providing a semiconductor memory device capable of performing a clock alignment training without delay factors affected by variations of process, voltage, and temperature (PVT) to output an internal data always at a predetermined timing regardless of the PVT variations, and a method for operating the semiconductor memory device.

In accordance with an aspect of the present invention, there is provided a semiconductor memory device, including a first pad configured to receive a first clock for an address signal and a command to be input in synchronization with the first clock, a second pad configured to receive a second clock having a higher frequency than the first clock for a data signal to be in synchronization with the second clock, a first buffering unit configured to buffer the first clock, a second buffering unit configured to buffer the second clock and divide the buffered clock to have the same frequency as the first clock, a data output circuit configured to output the data signal in response to an output clock of the second buffering unit, a delay unit configured to delay the output clock of the second buffering unit by a predetermined time, and a phase detector configured to detect a phase difference of an output clock of the delay unit and the output clock of the first buffering unit, and to output the detection result.

In accordance with another aspect of the present invention, there is provided a method for operating a semiconductor memory device, which includes receiving a first clock for an address signal and a command to be input in synchronization with the first clock, receiving a second clock having a higher frequency than the first clock to a data signal be in synchronization with the second clock, buffering the first clock for a predetermined first time to output a buffered first clock, buffering the second clock and dividing the buffered clock to have the same frequency as the first clock, to output a buffered second clock, outputting the data signal in response to the buffered second clock for a predetermined second time, delaying the buffered second clock by a combined duration of the predetermined first time and the predetermined second time to output a delayed second clock, and detecting a phase difference between the delayed second clock and the buffered first clock to output the detection result.

In accordance with a further aspect of the present invention, there is provided a semiconductor memory device, including a first pad configured to receive a first clock for an address signal and a command to be input in synchronization with the first clock, a second pad configured to receive a second clock having a higher frequency than the first clock for a data signal to be in synchronization with the second clock, a first buffering unit configured to buffer the first clock, a second buffering unit configured to buffer the second clock and divide the buffered clock to have the same frequency as the first clock, a data output circuit configured to output the data signal in response to an output clock of the second buffering unit, and a phase detector configured to detect a phase difference between an output clock of the first buffering unit and the output clock of the second buffering unit, and to output the detection result.

In accordance with a further aspect of the present invention, there is provided a method for operating a semiconductor memory device, which includes receiving a first clock for an address signal and a command to be input in synchronization with the first clock, receiving a second clock having a higher frequency than the first clock for a data signal to be in synchronization with the second clock, buffering the first clock for a predetermined first time to output a buffered first clock, buffering the second clock and dividing the buffered clock for a predetermined second time to have the same frequency as the first clock, to output a buffered second clock, outputting the data signal in response to the buffered second clock for a predetermined third time, and detecting a phase difference between the buffered first clock and the buffered second clock to output the detection result.

In accordance with a further aspect of the present invention, there is provided a semiconductor memory device, including a first buffering unit configured to buffer a first clock for an address signal and a command to be input in synchronization with the first clock, a second buffering unit configured to buffer a second clock for a data signal to be in synchronization with the second clock to output a buffered second clock having the same frequency as the first clock, a data output circuit configured to output an internal data in response to the buffered second clock, a delay unit configured to delay the buffered second clock by a delay time caused by the first buffering unit and the data output circuit, and a phase detector configured to detect a phase difference between an output clock of the delay unit and the output clock of the first buffering unit, and to output the detection result.

In accordance with a further aspect of the present invention, there is provided a semiconductor memory device, including a first buffering unit configured to buffer a first clock for an address signal and a command to be input in synchronization with the first clock, a second buffering unit configured to buffer a second clock for a data signal to be in synchronization with the second clock to output a buffered second clock having the same frequency as the first clock, a data output circuit configured to output a data signal in response to the buffered second clock, and a phase detector configured to detect a phase difference between the buffered first clock and the buffered second clock and to output the detection result.

DESCRIPTION OF SPECIFIC EMBODIMENTS

Hereinafter, a semiconductor memory device in accordance with the present invention will be described in detail with reference to the accompanying drawings.

Figure 1:
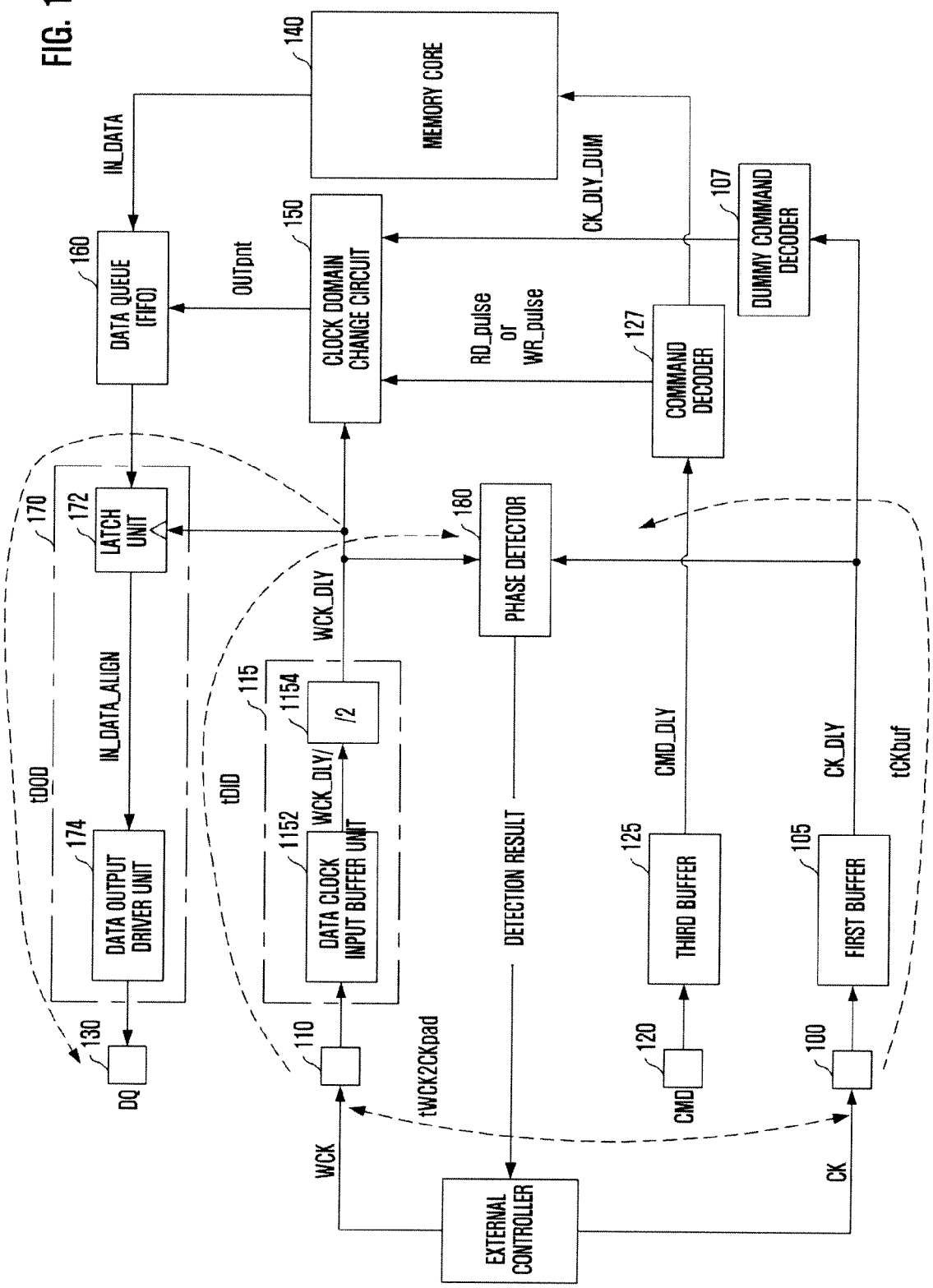
FIG. 1 is a block diagram of a semiconductor memory device in accordance with a first embodiment of the present invention.

FIG. 1 is a block diagram of a semiconductor memory device in accordance with a first embodiment of the present invention.

Referring to FIG. 1, the semiconductor memory device includes a first pad 100, a second pad 110, a third pad 120, a first buffer 105, a second buffer 115, a third buffer 125, a phase detector 180, a memory core 140, a clock domain change circuit 150, a data queue 160, and a data output circuit 170. The semiconductor memory device further includes a command decoder 127, and a dummy command decoder 107. The first pad 100 receives a system clock CK from an external controller to synchronize an address signal and an operation command CMD to the system clock CK. The second pad 110 receives a data clock WCK of a higher frequency than the system clock CK from the external controller to synchronize a data signal to the data clock WCK. The third pad 120 receives the operation command CMD. The first buffer 105 buffers the system clock CK input from the first pad 100. The second buffer 115 buffers the data clock WCK input from the second pad 110 so that the data clock WCK has the same frequency as the system clock CK. The third buffer 125 buffers the operation command CMD input from the third pad 120. The phase detector 180 detects a phase difference between a buffered system clock CK_DLY input from the first buffer 105 and a buffered/divided data clock WCK_DLY input from the second buffer 115 to output the detection results to the external controller. The memory core 140 performs an internal operation such as storing input data and outputting stored data, in response to a buffered operation command CMD_DLY from the third buffer 125. The clock domain change circuit 150 synchronizes the buffered operation command CMD_DLY, which is input thereinto in synchronization with the buffered system clock CK_DLY, to the buffered/divided data clock WCK_DLY. The data queue 160 stores an internal data IN_DATA from the memory core 140 to output it in response to an output signal OUTpnt of the clock domain change circuit 150. The data output circuit 170 aligns the internal data IN_DATA from the data queue 160 on the basis of the buffered/divided data clock WCK_DLY, to output the aligned internal data to a predetermined data input/output pad 130. The command decoder 127 decodes the buffered operation command CMD_DLY from the third buffer 125 to output the decoded signal to the memory core 140 and the clock domain change circuit 150. The dummy command decoder 107 outputs the buffered system clock CK_DLY from the first buffer 105 to the clock domain change circuit 150 in synchronization with the decoded signal.

The second buffer 115 includes a data clock input buffer unit 1152 and a frequency dividing unit 1154. The data clock input buffer unit 1152 buffers the data clock WCK to output a buffered data clock WCK_DLY/. The frequency dividing unit 1154 divides a frequency of the buffered data clock WCK_DLY/ from the data clock input buffer 1152 so that the buffered/divided data clock WCK_DLY has the same frequency as the buffered system clock CK_DLY.

The data output circuit 170 includes a latch unit 172 and a data output driver unit 174. The latch unit 172 aligns the internal data IN_DATA on the basis of the buffered/divided data clock WCK_DLY input from the second buffer 115 to output an aligned internal data IN_DATA_ALIGN. The data output driver unit 174 drives the aligned internal data IN_DATA_ALIGN from the latch unit 172 to the predetermined data input/output pad 130.

The phase of the data clock WCK is changed based on the detected phase difference between the buffered system clock CK_DLY and a buffered/divided data clock WCK_DLY, which is output from the phase detector 180. To this end, the phase detector 180 detects a phase difference between the buffered system clock CK_DLY and the buffered/divided data clock WCK_DLY to output the detection result to an external controller. Then, the external controller changes a phase of the data clock WCK according to the detection result to output the changed data clock to a semiconductor memory device.

Hereinafter, a clock alignment training process of the semiconductor memory device will be described with reference to FIG. 2.

Figure 2:
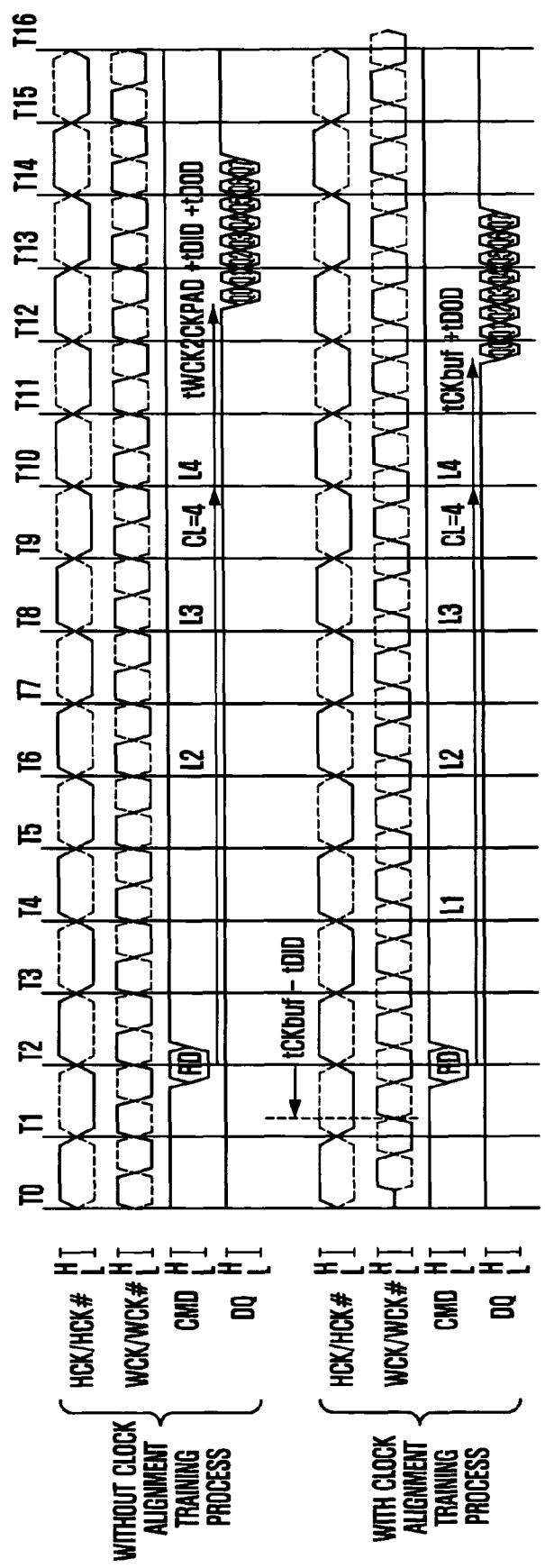
FIG. 2 is a timing diagram illustrating a clock alignment training operation of the semiconductor memory device of FIG. 1.

FIG. 2 is a timing diagram illustrating a clock alignment training operation of the semiconductor memory device of FIG. 1.

The semiconductor memory device outputs an internal data to an external controller on the basis of the data clock WCK in response to the operation command CMD (a read command RD_CMD herein) input thereinto on the basis of the system clock CK, as described above.

The phase difference between the system clock CK and the data clock WCK, if present, delays or advances the transfer of the internal data to the external controller by a duration corresponding to the phase difference. Therefore, the clock alignment training process is performed to reduce the phase difference between the system clock CK and the data clock WCK at an early stage of the operation of the semiconductor memory device. The clock alignment training process includes detecting a phase difference between the data clock WCK and the system clock CK applied by the external controller to transfer the detection result to the external controller.

Referring to FIGS. 1 and 2, let's assume that: a duration corresponding to a phase difference between the system clock CK applied to the first pad 100 of the semiconductor memory device and the data clock WCK applied to the second pad 110 is tWCK2CKpad; a time needed for transferring the system clock CK from the first pad 100 to the phase detector 180 detecting a phase difference between the buffered system clock CK_DLY and the buffered/divided data clock WCK_DLY, i.e., a time needed for transferring the system clock CK through the first buffer 105 is tCKbuf; a time needed for transferring the data clock WCK from the second pad 110 to the phase detector 180, i.e., a time needed for transferring the data clock WCK through the second buffer 115 is tDID; and a time needed for transferring the internal data IN_DATA from the memory core 140 to the predetermined data input/output pad 130 in response to the buffered/divided data clock WCK_DLY, i.e., a time needed for transferring the internal data IN_DATA through the data output circuit 170 is tDOD.

Before performing the clock alignment training, the data is output with a delay time added to the predetermined output timing through the predetermined data input/output pad 130. Here, the predetermined output timing is the point of 4tck after the receipt of the operation command CMD, since CL=4. The delay time includes tWCK2CKpad, tDID, and tDOD, where tWCK2CKpad is the duration corresponding to the phase difference between the system clock CK applied to the first pad 100 and the data clock WCK applied to the second pad 110, tDID is the time needed for transferring the data clock WCK through the second buffer 115, and tDOD is the time needed for transferring the internal data IN_DATA through the data output circuit 170. Consequently, internal data Q0, Q1, Q2, Q3, Q4, Q5, Q6 and Q7 are output after 4tck+tWCK2CKpad+tDID+tDOD from the receipt of the operation command CMD through the predetermined data input/output pad 130.

The phase detector 180 detects a phase difference between the system clock CK and the data clock WCK as follows. If the time point when the system clock CK is applied to the first pad 100 is 0, and the time point when the data clock WCK is applied to the second pad 110 is A, then the duration corresponding to the phase difference between the data clock WCK and the system clock CK is A. In addition, the time point when the data clock WCK arrives at the phase detector 180 is A+tDID, and the time point when the system clock CK arrives at the phase detector 180 is tCKbuf. Accordingly, when the phase difference between the data clock WCK and the system clock CK is detected by the phase detector 180, the phases of clocks are A+tDID and tCKbuf, respectively. To reduce the phase difference, A+tDID will become tCKbuf, i.e., A=tCKbuf−tDID. In other words, The phase detector 180 detects the time point A, corresponding to the input time of the data clock WCK, as tCKbuf−tDID, and then outputs the detection result to the external controller.

Then, the phase detection training operation is performed to advance the input point of the data clock WCK from the external controller to A, i.e., tCKbuf−tDID. As such, after the phase detection training, the timing point for outputting data through the predetermined data input/output pad 130 will become as follows.

Adding tDID and tDOD to the input point of the data clock WCK, the timing point for outputting data is A+tDID+tDOD=tCKbuf−tDID+tDID+tDOD=tCKbuf+tDOD. Here, tDID is the time needed for transferring the data clock WCK through the second buffer 115, and tDOD is the time needed for transferring the internal data IN_DATA through the data output circuit 170. As a result, the internal data Q0, Q1, Q2, Q3, Q4, Q5, Q6 and A7 are output with a delay time of tCKbuf+tDOD after the predetermined output timing of the internal data, where the predetermined output timing is the point of 4tck after the receipt of the operation command CMD, since CL=4.

As described above, after performing the clock alignment training operation, the timing point for outputting data becomes tCKbuf+tDOD, which is smaller than the timing point for outputting data without the clock alignment training operation (tWCK2Ckpad+tDID+tDOD).

Although the phase difference between the system clock CK and the data clock WCK is reduced successfully, the delay time of outputting data is not eliminated completely by the clock alignment training. Nevertheless, the semiconductor memory device in accordance with the first embodiment of the present invention can output data normally. This is because the external controller is provided with a clock data recovery (CDR) and a latency time compensation circuit therein to compensate the phase distortion of the data input into the external controller.

However, since tCKbuf, tDOD and tDID determining the phase difference between the system clock CK and the data clock WCK are affected by the variations of process, voltage and temperature (PVT) of the semiconductor memory device, the phase difference in an actual operation may be greater than the maximum phase difference value capable of being compensated by the external controller. In such a case, data cannot be input/output normally, which is similar to the case before the clock alignment training.

To resolve this, the external controller can also be designed to have the CDR or the latency time compensation circuit capable of compensating a sufficient phase difference between the system clock CK and the data clock WCK. However, in such a case, the CDR and the latency time compensation circuit requires much more space, increasing the size of the external controller.

This can be resolved by a semiconductor memory device in accordance with another embodiment of the present invention to be described hereinafter.

Figure 3:
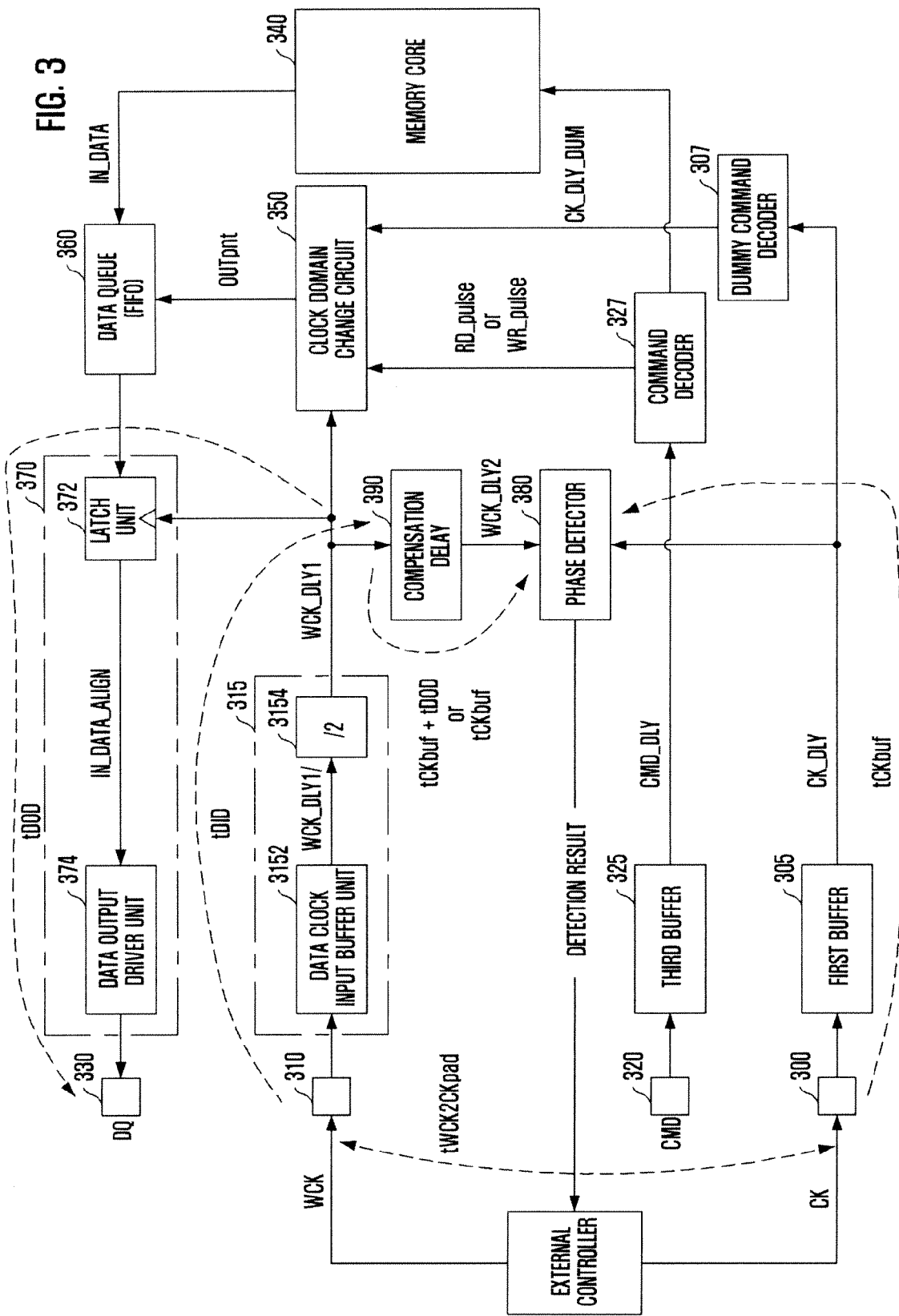
FIG. 3 is a block diagram of a semiconductor memory device in accordance with a second embodiment of the present invention.

FIG. 3 is a block diagram of a semiconductor memory device in accordance with a second embodiment of the present invention.

Referring to FIG. 3, the semiconductor memory device includes a first pad 300, a second pad 310, a third pad 320, a first buffer 305, a second buffer 315, a third buffer 325, a memory core 340, a clock domain change circuit 350, a data queue 360, a data output circuit 370, a phase detector 380, and a compensation delay unit 390. The semiconductor memory device further includes a command decoder 327, and a dummy command decoder 307. The first pad 300 receives a system clock CK from an external controller to synchronize an address signal and an operation command CMD to the system clock CK. The second pad 310 receives a data clock WCK of a higher frequency than the system clock CK from the external controller to synchronize a data signal to the data clock WCK. The third pad 320 receives the operation command CMD. The first buffer 305 buffers the system clock CK input from the first pad 300 to output a buffered system clock CK_DLY. The second buffer 315 buffers the data clock WCK input from the second pad 310 to output a buffered/divided data clock WCK_DLY1 having a frequency identical to that of the system clock CK. The third buffer 325 buffers the operation command CMD input from the third pad 320 to output a buffered operation command CMD_DLY. The memory core 340 performs an internal operation such as storing input data and outputting stored data, in response to the buffered operation command CMD_DLY from the third buffer 325. The clock domain change circuit 350 synchronizes the buffered operation command CMD_DLY, which is input thereinto in synchronization with the buffered system clock CK_DLY, to the buffered/divided data clock WCK_DLY1. The data queue 360 stores an internal data IN_DATA from the memory core 340 to output it in response to an output signal OUTpnt of the clock domain change circuit 350. The data output circuit 370 aligns the data input from the data queue 360 on the basis of the buffered/divided data clock WCK_DLY1, to output the aligned data to a predetermined data input/output pad 330. The compensation delay unit 390 delays the buffered/divided data clock WCK_DLY1 from the second buffer 315 by tCKbuf+tDOD to output a delayed data clock WCK_DLY2, where tCKbuf is a time needed for operating the first buffer 305, and tDOD is a time needed for operating the data output circuit 370. The phase detector 380 detects a phase difference between the buffered system clock CK_DLY input from the first buffer 305 and the delayed data clock WCK_DLY2 input from the compensation delay unit 390 to output the detection result to the external controller. The command decoder 327 decodes the buffered operation command CMD_DLY input from the third buffer 325 to output the decoded signal to the memory core 340 and the clock domain change circuit 350. The dummy command decoder 307 outputs the buffered system clock CK_DLY from the first buffer 305 to the clock domain change circuit 350 so that the buffered operation command CMD_DLY is synchronized with the buffered system clock CK_DLY.

The second buffer 315 includes a data clock input buffer unit 3152 and a frequency dividing unit 3154. The data clock input buffer unit 3152 buffers the data clock WCK to output a buffered data clock WCK_DLY/. The frequency dividing unit 3154 divides a frequency of the buffered data clock WCK_DLY/ from the data clock input buffer 3152 so that the buffered/divided data clock WCK_DLY1 has the same frequency as the buffered system clock CK_DLY.

The data output circuit 370 includes a latch unit 372 and a data output driver unit 374. The latch unit 372 aligns the internal data IN_DATA on the basis of the buffered/divided data clock WCK_DLY1 input from the second buffer 315 to output an aligned internal data IN_DATA_ALIGN. The data output driver unit 374 drives the aligned internal data IN_DATA_ALIGN from the latch unit 372 to a predetermined data input/output pad 330.

The phase of the data clock WCK is changed based on the detected phase difference between the buffered system clock CK_DLY and the delayed data clock WCK_DLY2 output from the phase detector 380. To this end, the phase detector 380 detects a phase difference between the buffered system clock CK_DLY and the delayed data clock WCK_DLY2 to output the detection result to the external controller. Then, the external controller changes a phase of the data clock WCK according to the detection result to output the changed data clock to a semiconductor memory device.

Hereinafter, a clock alignment training process of the semiconductor memory device will be described with reference to FIG. 4.

Figure 4:
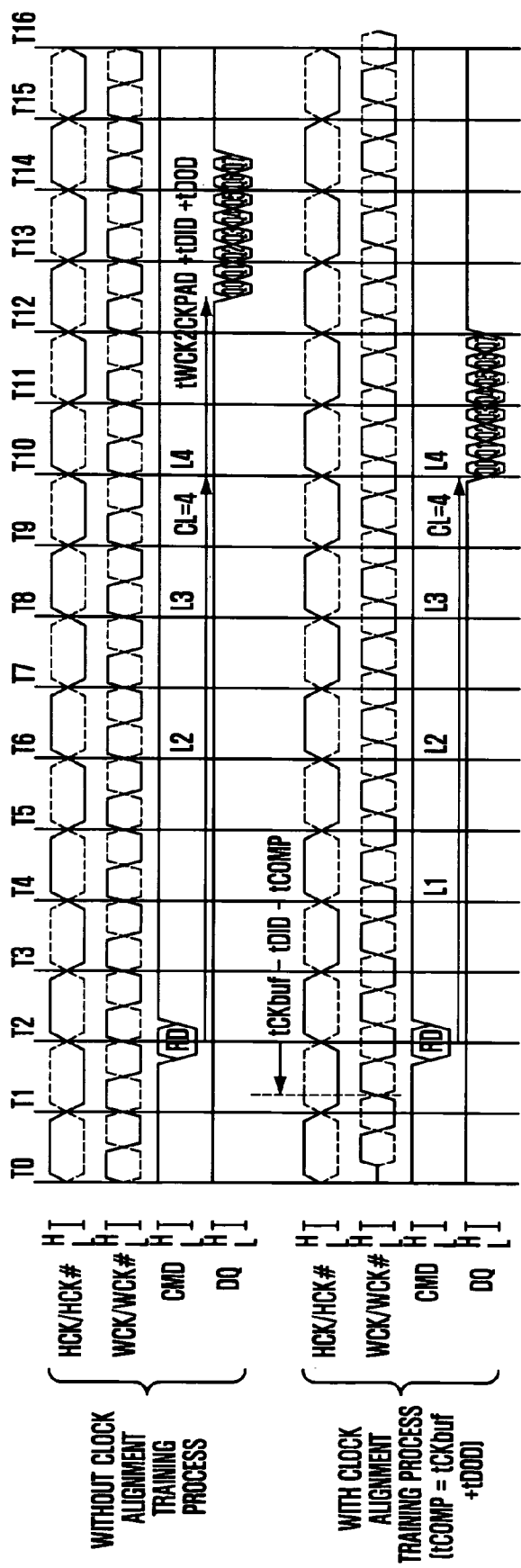
FIG. 4 is a timing diagram illustrating a clock alignment training operation of the semiconductor memory device of FIG. 3.

FIG. 4 is a timing diagram illustrating a clock alignment training operation of the semiconductor memory device of FIG. 3.

The semiconductor memory device outputs an internal data to an external controller on the basis of the data clock WCK in response to the operation command CMD (a read command RD_CMD herein) input thereinto on the basis of the system clock CK, as described above.

The phase difference between the system clock CK and the data clock WCK, if present, delays or advances the transfer of the internal data to the external controller by a duration corresponding to the phase difference.

Therefore, the clock alignment training process is performed to reduce the phase difference between the system clock CK and the data clock WCK at an early stage of the operation of the semiconductor memory device. The clock alignment training process includes detecting a phase difference between the data clock WCK and the system clock CK applied by the external controller to transfer the detection result to the external controller.

Referring to FIGS. 3 and 4, let's assume that: a duration corresponding to a phase difference between the system clock CK applied to the first pad 300 of the semiconductor memory device and the data clock WCK applied to the second pad 310 is tWCK2CKpad; a time needed for transferring the system clock CK from the first pad 300 to the phase detector 380 detecting a phase difference between the buffered system clock CK_DLY and the delayed data clock WCK_DLY2, i.e., a time needed for transferring the system clock CK through the first buffer 305 is tCKbuf; a time needed for transferring the data clock WCK from the second pad 310 to the compensation delay unit 390, i.e., a time needed for transferring the data clock WCK through the second buffer 315 is tDID; and a time needed for transferring the internal data IN_DATA from the memory core 340 to the predetermined data input/output pad 330 in response to the buffered/divided data clock WCK_DLY1 from the second buffer 315 is tDOD.

Before performing the clock alignment training, the internal data is output with a delay time after the predetermined output timing through the predetermined data input/output pad 330. Here, the predetermined output timing is the point of 4tck after the receipt of the operation command CMD, since CL=4. The delay time includes tWCK2Ckpad, tDID, and tDOD, where tWCK2CKpad is the duration corresponding to the phase difference between the system clock CK applied to the first pad 300 and the data clock WCK applied to the second pad 310, tDID is the time needed for transferring the data clock WCK through the second buffer 315, and tDOD is the time needed for transferring the internal data IN_DATA in response to the buffered/divided data clock WCK_DLY1.

Here, the compensation delay unit 390 does not affect the output timing of the internal data before the clock alignment training operation, because it is valid only during the clock alignment training operation. Consequently, the internal data Q0, Q1, Q2, Q3, Q4, Q5, Q6 and Q7 are output after 4tck+tWCK2CKpad+tDID+tDOD from the receipt of the operation command CMD through the predetermined data input/output pad 330.

Then, the phase detector 380 detects a phase difference between the system clock CK and the data clock WCK as follows. If the time point when the system clock CK is applied to the first pad 300 is 0, and the time point when the data clock WCK is applied to the second pad 310 is A, then the duration corresponding to the phase difference between the data clock WCK and the system clock CK is A. In addition, the time point when the data clock WCK arrives at the compensation delay unit 390 is A+tDID. If the delay time of the data clock WCK at the compensation delay unit 390 is tCOMP, then the time point when the data clock WCK arrives at the phase detector 380 is A+tCOMP+tDID. Seeing that the time point when the system clock CK arrives at the phase detector 380 is tCKbuf, when the phase difference between the data clock WCK and the system clock CK is detected by the phase detector 380, the phases of the clocks are A+tCOMP+tDID and tCKbuf, respectively. To reduce the phase difference, A+tCOMP+tDID will become tCKbuf, i.e., A=tCKbuf−tDID−tCOMP. In other words, the phase detector 380 detects the time point A, corresponding to the input time of the data clock WCK as tCKbuf−tDID−tCOMP, and then outputs the detection result to the external controller.

Then, the phase detection training operation is performed to advance the input point of the data clock WCK from the external controller to A, i.e., tCKbuf−tDID−tCOMP. As such, after the phase detection training operation, the timing for outputting data through the predetermined data input/output pad 330 will become as follows.

Adding tDID and tDOD to the input point of the data clock WCK, A+tDID+tDOD=tCKbuf−tDID−tCOMP+tDID+tDOD=tCKbuf+tDOD−tCOMP. Here, tDID is the time needed for transferring the data clock WCK through the second buffer 315, and tDOD is the time needed for transferring the internal data IN_DATA through the data output circuit 370. In the case where tCOMP is defined to be tCKbuf+tDOD, the result value equals 0. Accordingly, the internal data Q0, Q1, Q2, Q3, Q4, Q5, Q6 and A7 are output exactly at the predetermined output timing of the internal data, where the predetermined output timing is the point of 4tck after the receipt of the operation command CMD, since CL=4. Furthermore, in the case where tCOMP is defined to be tCKbuf, it equals tDOD. Accordingly, the internal data Q0, Q1, Q2, Q3, Q4, Q5, Q6 and A7 are output with a delay time tDOD after the predetermined output timing of the internal data, where the predetermined output timing is the point of 4tck after the receipt of the operation command CMD, since CL=4. In similar way, in the case where the tCOMP is defined to be tDOD, it equals tCKbuf. Accordingly, the internal data Q0, Q1, Q2, Q3, Q4, Q5, Q6 and A7 are output with a delay time tCKbuf after the predetermined output timing of the internal data, where the predetermined output timing is the point of 4tck after the receipt of the operation command CMD, since CL=4.

As described above, the semiconductor memory device in accordance with the second embodiment of the present invention includes the compensation delay unit 390 between the second buffer 315 and the phase detector 380 so that the buffered/divided data clock WCK_DLY1 output from the second buffer 315 is not directly input into the phase detector 380. In other words, instead of the buffered/divided data clock WCK_DLY1, the delayed data clock WCK_DLY2 generated by delaying the buffered/divided data clock WCK_DLY1 by a predetermined delay time (by tCKbuf+tDOD, by tCKbuf, or by tDOD) is input into the phase detector 380.

As such, the time tCKbuf for operating the first buffer 305 and the time tDOD for operating the data output circuit 370 which may affect the output timing of the internal data are already included in the output signal of the phase detector 380 to be transferred to the external controller.

Therefore, the external controller can change the phase of the data clock WCK taking the time tCKbuf for operating the first buffer 305 and the time tDOD for operating the data output circuit 370 into consideration.

As such, the delay factors such as tCKbuf+tDOD, tCKbuf, and tDOD that can be affected by the variations of process, voltage and temperature (PVT) of the semiconductor memory device are removed in advance during the clock alignment training operation of the semiconductor memory device. Therefore, after the clock alignment training of the semiconductor memory device, the internal data can be output always exactly at the predetermined timing (at the point of 4tck herein, since CL=4) after the application of the operation command CMD (the read command herein) through the predetermined input/output pad 330 regardless of the PVT variations.

As described above, the semiconductor memory device can remove delay factors such as tCKbuf+tDOD, tCKbuf, and tDOD that can be affected by the variations of PVT of the semiconductor memory device during the clock alignment training, so that the internal data can be output always exactly at the predetermined timing after the application of the operation command regardless of the PVT variations. Consequently, it is possible to stably output data at a constant output timing.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a first pad configured to receive a system clock for an address signal and a command to be input in synchronization with the system clock;
   a second pad configured to receive a data clock having a higher frequency than the system clock for a data signal to be in synchronization with the data clock;
   a first buffering unit configured to buffer the system clock;
   a second buffering unit configured to buffer the data clock and divide the buffered clock to have the same frequency as the system clock;
   a data output circuit configured to output the data signal in response to an output clock of the second buffering unit; and
   a phase detector configured to detect a phase difference between an output clock of the first buffering unit and the output clock of the second buffering unit, and to output the detection result to an external controller,
   wherein the system clock and the data clock are separately input from the external controller.

2. The semiconductor memory device as recited in claim 1, wherein a phase of the data clock is changed according to the detection result of the phase detector.

3. The semiconductor memory device as recited in claim 1, wherein the second buffering unit includes:
   a clock buffer unit configured to buffer the data clock; and
   a frequency dividing unit configured to divide a frequency of an output clock of the clock buffer unit.

4. The semiconductor memory device as recited in claim 1, wherein the data output circuit includes:
   a latch unit configured to align the data signal on the basis of the output clock of the second buffer; and
   a data output driver unit configured to drive an output data of the latch unit to a predetermined data input/output pad.

5. A method for operating a semiconductor memory device, the method comprising:
   receiving a system clock from an external controller for an address signal and a command to be input in synchronization with the system clock;
   receiving a data clock from the external controller—having a higher frequency than the system clock for a data signal to be in synchronization with the data clock;
   buffering the system clock for a predetermined first time to output a buffered system clock;
   buffering the data clock and dividing the buffered clock for a predetermined second time to have the same frequency as the system clock, to output a buffered data clock;
   outputting the data signal in response to the buffered data clock for a predetermined third time; and
   detecting a phase difference between the buffered system clock and the buffered data clock to output the detection result,
   wherein the system clock and the data clock are separately inputted from the external controller.

6. The method as recited in claim 5, further comprising changing a phase of the data clock according to the detection result.

7. The method as recited in claim 5, wherein the outputting of the data signal includes:
   aligning the data signal on the basis of the buffered data clock; and
   driving the aligned data signal to a predetermined data input/output pad.

8. A semiconductor memory device, comprising:
   a first buffering unit configured to buffer a system clock from the external controller for an address signal and a command to be input in synchronization with the system clock;
   a second buffering unit configured to buffer a data clock from the external controller for a data signal to be in synchronization with the data clock to output a buffered data clock having the same frequency as the system clock;

a data output circuit configured to output a data signal in response to the buffered data clock; and a phase detector configured to detect a phase difference between the buffered system clock and the buffered data clock and to output the detection result.

9. The semiconductor memory device as recited in claim 1, further comprising:

a delay unit configured to delay the output clock of the second buffering unit by a predetermined time.

10. The semiconductor memory device as recited in claim 9, wherein the phase detector detects a phase difference of an output clock of the delay unit and the output clock of the first buffering unit, and outputs the detection result.

11. The semiconductor memory device as recited in claim 8, further comprising:

a delay unit configured to delay the buffered data clock by a delay time caused by the first buffering unit and the data output circuit.

12. The semiconductor memory device as recited in claim 11, wherein the phase detector detects a phase difference between an output clock of the delay unit and the output clock of the first buffering unit, and outputs the detection result.

* * * * *